United States Patent [19]

Dimyan

[11] 4,094,006
[45] June 6, 1978

[54] GAPLESS MAGNETIC BUBBLE PROPAGATION CIRCUIT

[75] Inventor: Magid Yousri Dimyan, San Diego, Calif.

[73] Assignee: Burroughs Corporation, Detroit, Mich.

[21] Appl. No.: 737,206

[22] Filed: Nov. 1, 1976

[51] Int. Cl.² ............................................. G11C 19/08
[52] U.S. Cl. ...................................................... 365/39
[58] Field of Search ................... 340/174 TF; 365/39, 365/42

[56] References Cited

U.S. PATENT DOCUMENTS

| 3,875,568 | 4/1975 | Bailey | 340/174 TF |
| 3,927,398 | 12/1975 | Dimyan | 340/174 TF |
| 3,971,037 | 7/1976 | Enoch | 340/174 TF |

OTHER PUBLICATIONS

Proceedings of the IEEE — Dec. 1973, pp. 1761–1762.

Primary Examiner—James W. Moffitt
Attorney, Agent, or Firm—Joseph R. Dwyer; Mervyn L. Young; Kevin R. Peterson

[57] ABSTRACT

A magnetic bubble propagation device comprising a pattern of magnetic material formed of the so-called gap tolerant elements, positioned over a bubble supporting material to define a bubble propagation path. Each element of the pattern is spaced from the bubble material such that a gradient is formed in the spacing between the element and the bubble material in the direction of the propagation path. A rotating magnetic field of sufficient strength to magnetize the pattern is applied in the plane of the material and the spacing gradient causes the bubble to move from one element to an adjacent element in one complete field rotation. This device is particularly characterized in that, with the combination of the pattern elements and the spacing gradient thereof, the gaps between the elements are eliminated.

3 Claims, 3 Drawing Figures

GAPLESS MAGNETIC BUBBLE PROPAGATION CIRCUIT

CROSS REFERENCE TO RELATED APPLICATION

Reference is made to U.S. Application entitled, "Gapless Magnetic Bubble Expander-Detector Circuit" by Magid Y. Dimyan, Ser. No. 737,203, filed Nov. 1, 1976, and the invention disclosed therein which is compatible with the invention disclosed herein.

BACKGROUND OF THE INVENTION

This invention relates to magnetic bubble domain propagation circuits and in particular to a propagation circuit which employs an applied rotating magnetic field plus the effect of a gradient in the spacing between the bubble material and a magnetic film for the propagation and manipulation of bubble domains.

Memory storage in conventional magnetic bubble devices is usually accomplished by the presence or absence of bubble domains propagated and manipulated on a chip by the use of an overlay magnetic (Permalloy) circuit in conjunction with an in-plane rotating magnetic field in the presence of a bias magnetic field.

The first circuit employed for bubble propagation is the wellknown T-I bar pattern such as described in "Magnetic Bubble Technology: Integrated — Circuit Magnetics for Digital Storage and Processing" edited by Hsu Chang, IEEE Press 1975, Library of Congress Catalog #73-87653, Page 20, paragraph entitled, "Field Access Devices — Rotating Planar Field." A subsequent pattern employed is the Y-bar propagate element as described at page 24 of this same book.

However, the minimum feature size, that is, the smallest dimension in the pattern, which in these prior art patterns is the gap between the Y or T and I bars, is approximately ⅛ to ¼ of the bubble diameter. Since the resolution limit of photolithography used in the process of forming the T-I and Y bar overlays is somewhere between 1 and 1.5 microns, it is evident that the smallest bubble diameter that can be used with these patterns is approximately 4.0 microns. This size is also a limitation in the storage density of the memory.

Recently, a new family of bubble propagation patterns, usually referred to as "gap tolerant" or sometimes called "half disc" or "wide gap" patterns, were described in the Intermag — MMM conference, Pittsburgh, Pa., June 1976, by Bell Laboratories, Rockwell International and Texas Instruments employees. These gas tolerant patterns have the main advantage in that their minimum feature size, (again in this case the gap between the propagate elements), is approximately half of the bubble diameter which for a selected bubble size, for example, 4.0 microns, leads to less stringent photolithographic requirements. Conversely, if one wishes to maintain stringent photolithographic requirements, then smaller bubble sizes could be tolerated. Thus, propagation circuits for two micron bubble diameter devices using wide gap patterns can be processed by means of photolithographic methods with an improvement in memory storage density by a factor of around 3 over the conventional T-I or Y bar circuit overlays, mentioned above.

Thus, it can be seen that although the memory devices have been improved by the gap tolerant patterns, it is the minimum feature size in magnetic bubble propagation circuitry (which thus far in the prior art is the gaps between elements) which limits the size of the domains and thus the storage density of the memory devices.

Accordingly, it is apparent that if the gaps between the elements can be eliminated, then the minimum feature size can be greatly increased. In such a case then, the feature size would not be the gaps but would be the width of the element itself —approximately equal to the bubble diameter — and thus the storage density would be greatly increased. However, elimination of the gaps alone would not suffice since directionality of propagation is imparted to the conventional T-I and Y bars and the gap tolerant circuits by means of the gaps, which gaps introduce asymmetry into the pattern. In other words, according to the prior art: no gaps, no directionality since it is the gaps that permit the formation of reversible roles in the propagate elements in response to the applied rotational magnetic field to attract the domains.

Considering the prior art further, in the U.S. Pat. No. 3,927,398 issued to Magid Y. Dimyan on Dec. 16, 1975 and entitled, "Magnetic Bubble Propagation Circuit," it was shown that a translation force acting on magnetic bubble domains can also be produced by means of gradient in spacing between bubble material and the propagate element. As described in this patent, an overlay of bars of uniform thickness of magnetic material were spaced from a film of bubble material with one end of the bar having a greater spacing than the other so as to form a gradient between the bubble material and the ends of each bar in the direction of a propagation. With this pattern, a periodic monopolar magnetic field applied in the plane of the bubble material and parallel to the propagation path, magnetized the bars causing the bubble to move from one bar to an adjacent bar across a gap between the bars. When the bars were demagnetized, i.e., the magnetic field ceased (being periodic), the bubble moved from the high end of the bar to the lower end. It is to be noted, however, that although the patented invention relied on the spacing gradient to move the bubble from one end of the bar to the other, a gap between the bars was still required to obtain an overall directionality through the device. Thus, feature size was still the gap which limited the size of the domains and the storage density of the memory device even though movement of the bubble domain was accomplished without an aplied magnetic field at certain times, albeit only within the bars themselves. This patented invention did, however, eliminate the need of a rotating magnetic field used prior thereto in the prior art devices.

SUMMARY AND OBJECTS OF THE INVENTION

Accordingly, it is a primary object of this invention to provide a magnetic bubble propagation device in which propagation is accomplished in the pattern but without gaps so that the minimum feature size is limited only by the minimum width of the propagate element, thus accomplishing maximum storage density in a bubble memory.

According to the invention, the primary object is accomplished by providing a pattern of magnetically soft material, (e.g., Permalloy), forming the gap tolerant elements, positioned over a bubble supporting material (e.g., magnetic Garnet) to define a bubble propagation path. Each element of the pattern is spaced from the bubble material such that a gradient is formed between the element and the bubble material in the direction of the propagation path, that is, one, or entry, end of the element is spaced further from the bubble material than the other, or exit, end of the element. Thus, asymmetry is introduced into the pattern for propagation purposes by means of the spacing gradient, and bubble propagation is produced by an in-plane rotating magnetic field operating together with the spacing gradient in a selected direction.

Utilizing this effect to create the desired directionality in a gapless propagation structure, an improvement in storage density of approximately 400% over the prior art gap tolerant patterns and about 1200% over the T-I and Y bar patterns is accomplished for a given minimum feature size.

BRIEF DESCRIPTION OF THE PREFERRED EMBODIMENT

Figure 1:
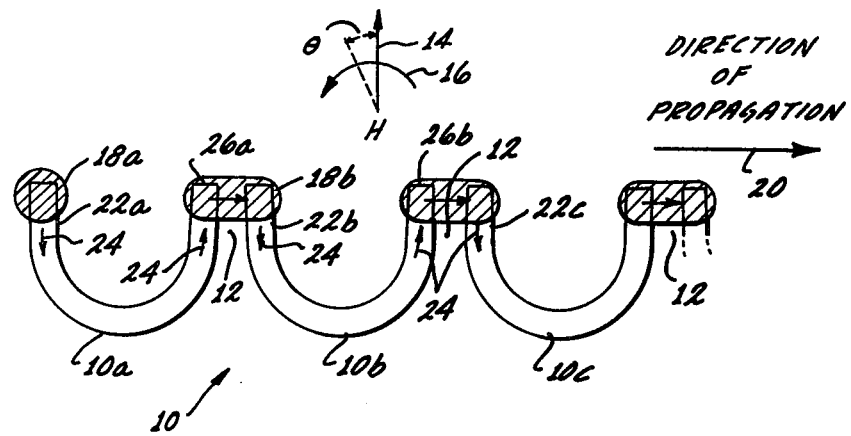
FIG. 1 is a schematic illustration of the gap tolerant propagation pattern as an example of the prior art showing the direction of propagation and rotating field.

Turning now first to the prior art, shown by way of an example in FIG. 1, it can be seen that there is shown a plurality of gap tolerant patters 10, generally of C-shaped or half-disc configuration, elements 10a, 10b and 10c being shown, formed of Permalloy or similar material by a photolithographic process and supported on a thin uniaxial magnetic film, such as magnetic Garnet, which is epitaxially grown, on a non-magnetic substrate, such as Gadolinium Gallium Garnet. For the sake of clarity and description of the prior art, the magnetic film and non-magnetic substrate material are not shown in this figure. In this pattern as well as in the hereinabove mentioned prior art patterns, each propagate element in the circuit is of the same length and width and the space or gap 12 between adjacent elements is uniform throughout the propagation path to maximize the number of storage points in the circuit as well as minimize propagation time for bubble movement through the storage lcoation in the bubble material.

In the operation of the disclosed prior art gap tolerant pattern, a magnetic field producing means provides an in-plane rotating magnetic field, represented by the arrows 14 and 16, which moves the bubble domains 18a and 18b, etc. in the direction of propagation as represented by arrow 20. Assuming negatively magnetically charged magnetic domains, such as 18a and 18b, and positively charged ends 22a and 22b of the elements, the bubbles will reside at ends 22a and 22b (when $\theta = 0$) of the elements 10a and 10b but as the magnetic field rotates in the direction of the arrow 16, the bubbles 18a and 18b will move along elements as shown by the arrow 24 ultimately to a position on the other or exit ends 26a and 26b of the elements. Further rotation of the magnetic field through the full total of 360° will cause the bubbles to jump or bridge the gaps 12 whereupon bubble 18a will be at the entry end 22b of element 10b and bubble 18a will be at the entry end 22c of element 10c, this bridging of the gaps 12 being made easily with minimum magnetostatic resistance since all ends are now of similar polarity when $\theta = 0$. This propagation will continue so long as the rotation of the magnetic field continues and, in accordance with existing bubble detection techniques, the existence of a bubble or the nonexistence of a bubble will indicate a "1" or a "0" in conventional digital processing techniques.

Figure 2:
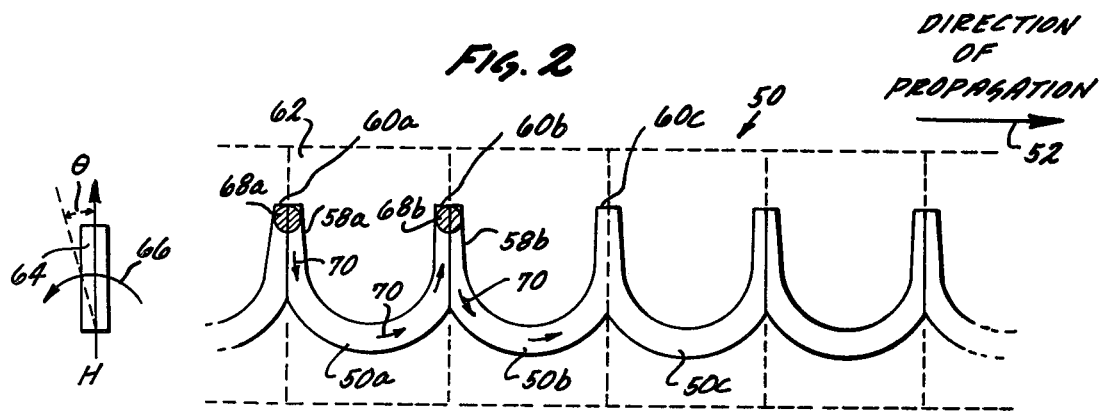
FIG. 2 is a schematic illustration of the top view of the propagation circuit in accordance with the present invention.
Figure 3:
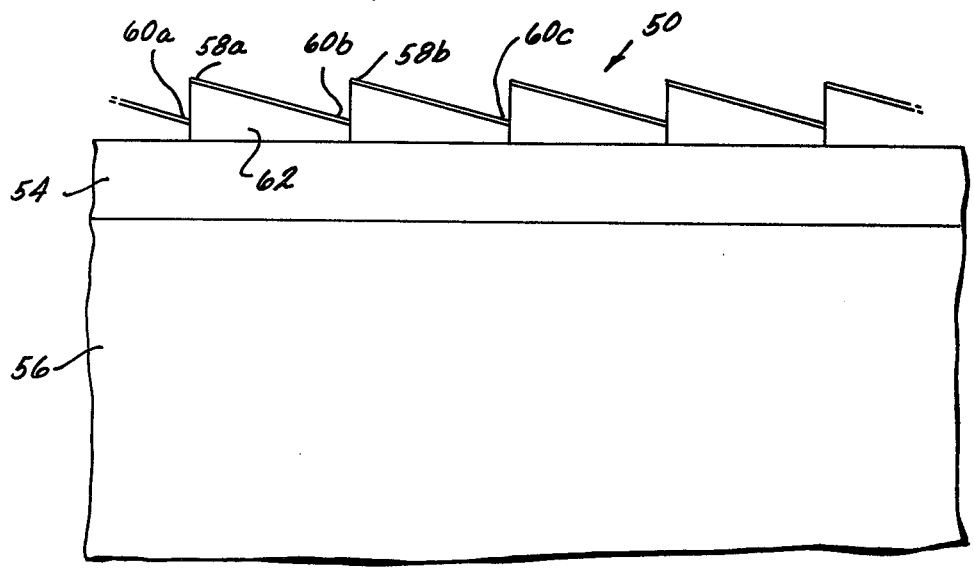
FIG. 3 is a side view of the propagation circuit constructed in accordance with the teachings of this invention.

Turning now to FIGS. 2 and 3 showing the present invention, the propagation circuit comprises a series of C-shaped or half-disc or any other gap tolerant propagate elements 50 made of a magnetic material, such as Permalloy, positioned along a predetermined propagation path on a magnetic bubble material; the direction of propagation being shown by arrow 52. In addition, as clearly shown in FIG. 2, the gap tolerant propagate elements 50 are arranged such that the spacing between the epitaxial film 54 (e.g., LPE epitaxy magnetic film) on the nonmagnetic substrate 56 (e.g., Gadolinium Gallium Garnet) is such that each gap tolerant element, such as 50a, 50b and 50c has a gradient in the direction of the bubble propagation. Each element in the circuit is preferably of the same length and preferably identical to obtain the maximum number of storage points in the circuit as well as minimize propagation time for bubble movement through the storage locations in the bubble material. As clearly shown in FIG. 3, relative to element 50a, the spacing between one end 58a the gap tolerant element 50a and the epitaxial material is greater than the spacing of the other end 60a from this same material to form a slope or gradient. This gradient is maintained, as are all other gradients under all the elements, by a wedge-shaped non-magnetic element 62 of material, such as $SiO_2$.

It is to be noted that the apparent continuity that appears in the elements in FIG. 2 is due to the shape of the ends 60a and 58b, for example, adjacent to one another.

In operation, a magnetic field producing structure 64, shown schematically in FIG. 2, provides an in-plane rotating field, shown here to be counterclockwise by the arrow 66. Assuming negatively charged bubbles 68a and 68b, the bubbles will reside under the exit end 58a and 58b of propagate elements 50a and 50b in the absence of an in-plane drive field. When the drive field is applied in a vertical direction (as shown in the drawings, i.e., $\theta = 0$), positive poles will be formed at the exit and entry ends of the patterns and the bubbles will span both ends. As the field rotates counterclockwise, as shown by arrow 66, the bubbles move (or continue to move as the case may be) in the direction of the gradient spacing and around the elements as shown by arrows 70 until they rest at the exit ends 60a and 60b of the elements. Further rotation will cause the bubbles to move, one element for each complete 360° rotation of the field.

As can be seen from the foregoing, directionality is given to the bubbles by the spacing gradient and not by a gap, as in the prior art and while the invention has been disclosed as operable in a pag tolerant environment, one skilled in the art can apply the teachings of this invention to still other patterns where entry and exits ends of the elements have essentially the same magnetic polarity when the direction of the magnetic field orientation is $\theta = 0$ as shown in FIG. 2 herein.

It is to be noted further that this invention is compatible with the gapless magnetic bubble expander-detector circuit as described and claimed in the U.S. application No. 737,203 entitled, "Gapless Magnetic Bubble Expander-Detector Circuit," supra.

What is claimed is:

1. A bubble domain propagating circuit for moving magnetic bubble domains along a predetermined path in a film of magnetic bubble material comprising:

a pattern of propagate elements in an overlay of magnetic material, said magnetic material being positioned over a film of magnetic bubble material and said propagate elements defining the bubble propagation path for advancing said domains therethrough, in response to consecutive cycles of a magnetic field, said magnetic field being rotated in the plane of said bubble material and being capable of magnetizing said elements, adjacent elements having ends which will have essentially the same polarity when subjected to said magnetic field in a direction perpendicular to said propagation path, and means for spacing said propagate elements from the bubble material to maintain a gradient between each of the elements and the bubble material in the direction of said propagation path.

2. The bubble domain propagation circuit as claimed in claim 1 in which said gradient maintaining means comprises a wedge-shaped, non-magnetic element located between each of said elements and said bubble material.

3. The bubble domain propagation as claimed in claim 2 wherein said propagate elements define a gap tolerant pattern but without the gaps in the direction of propagation.

* * * * *